United States Patent
Cao et al.

(10) Patent No.: US 10,365,379 B2
(45) Date of Patent: *Jul. 30, 2019

(54) COLORIMETRIC RADIATION DOSIMETRY

(71) Applicant: INTERNATIONAL BUSINESS MACHINES CORPORATION, Armonk, NY (US)

(72) Inventors: Qing Cao, Yorktown Heights, NY (US); Kangguo Cheng, Schenectady, NY (US); Zhengwen Li, Chicago, IL (US); Fei Liu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/102,804

(22) Filed: Aug. 14, 2018

(65) Prior Publication Data

US 2019/0004183 A1      Jan. 3, 2019

Related U.S. Application Data

(63) Continuation of application No. 15/250,090, filed on Aug. 29, 2016, now Pat. No. 10,209,367.

(51) Int. Cl.
*G01T 1/04* (2006.01)
*G03C 1/72* (2006.01)
*G01J 1/42* (2006.01)
*G01R 29/08* (2006.01)

(52) U.S. Cl.
CPC ............ *G01T 1/04* (2013.01); *G01J 1/429* (2013.01); *G01R 29/0857* (2013.01); *G03C 1/72* (2013.01)

(58) Field of Classification Search
CPC ........ G01T 1/04; G03C 1/72; G01R 29/0857; G01J 1/429
See application file for complete search history.

(56) References Cited

U.S. PATENT DOCUMENTS

| 3,501,636 A | 3/1970 | Sherwood |
| 3,604,929 A | 9/1971 | Goulin |
| 5,206,118 A | 4/1993 | Sidney et al. |
| 7,476,874 B2 * | 1/2009 | Patel ................. G01T 1/04 250/474.1 |

(Continued)

FOREIGN PATENT DOCUMENTS

| FR | 2139725 A1 | 1/1973 |
| FR | 2171865 A1 | 9/1973 |

OTHER PUBLICATIONS

List of IBM Patents or Patent Applications Treated as Related dated Aug. 14, 2018, 2 pages.

*Primary Examiner* — Michael C Bryant
(74) *Attorney, Agent, or Firm* — Tutunjian & Bitetto, P.C.; Vazken Alexanian

(57) ABSTRACT

A dosimetry device includes a first chamber formed on a substrate with a first decomposable barrier sensitive to radiation and a first chemical component. A second chamber is formed on the substrate in proximity of the first chamber and includes a second decomposable barrier sensitive to radiation and a second chemical component. Upon a radiation event, decomposition of the first and second barriers of the first and second chambers permits a mixing of the first and second chemical components to cause a visible change of the dosimetry device.

20 Claims, 6 Drawing Sheets

(56) References Cited

U.S. PATENT DOCUMENTS

| | | |
|---|---|---|
| 8,586,366 B2 | 11/2013 | Hiroki et al. |
| 9,170,337 B2 | 10/2015 | Cao et al. |
| 9,519,066 B2 | 12/2016 | Hayward et al. |
| 2011/0081724 A1 | 4/2011 | Swager et al. |
| 2011/0286314 A1* | 11/2011 | Braunberger ........... G04F 13/04 368/327 |
| 2016/0025701 A1 | 1/2016 | Pratx et al. |
| 2017/0023681 A1 | 1/2017 | Patel |

* cited by examiner

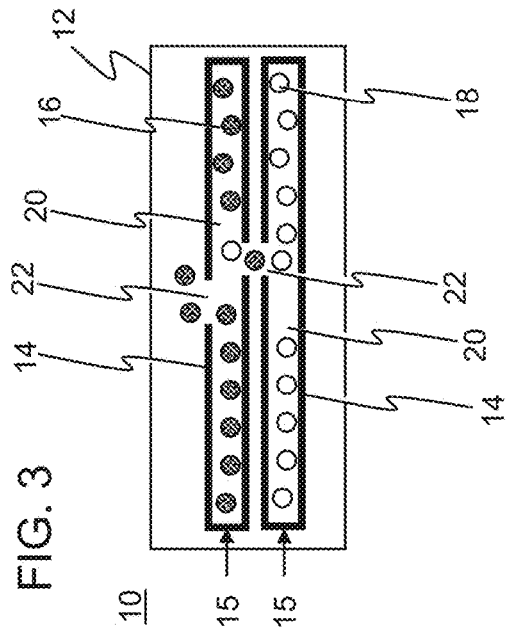
FIG. 1
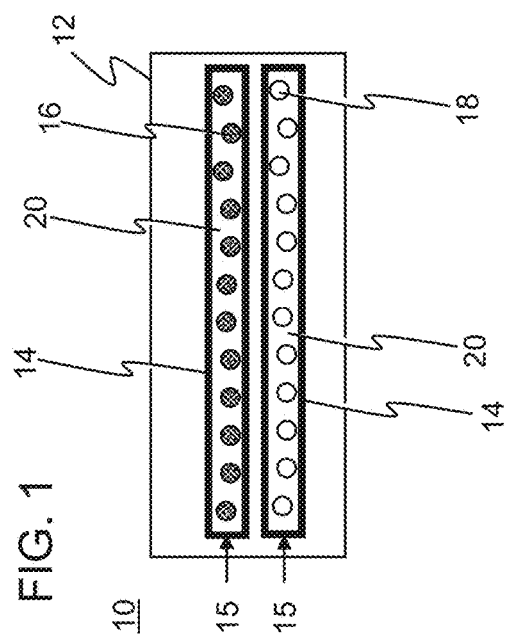
FIG. 3
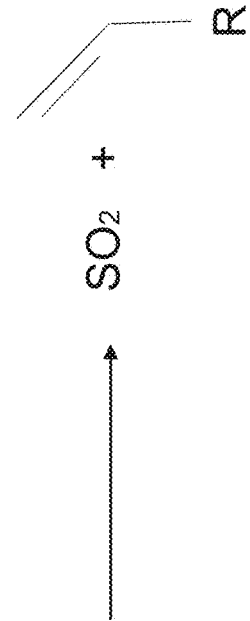
FIG. 2
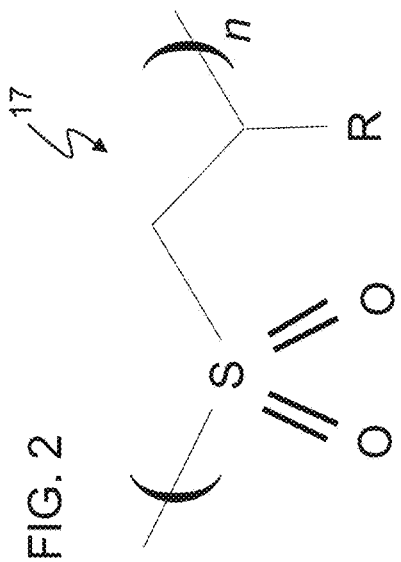

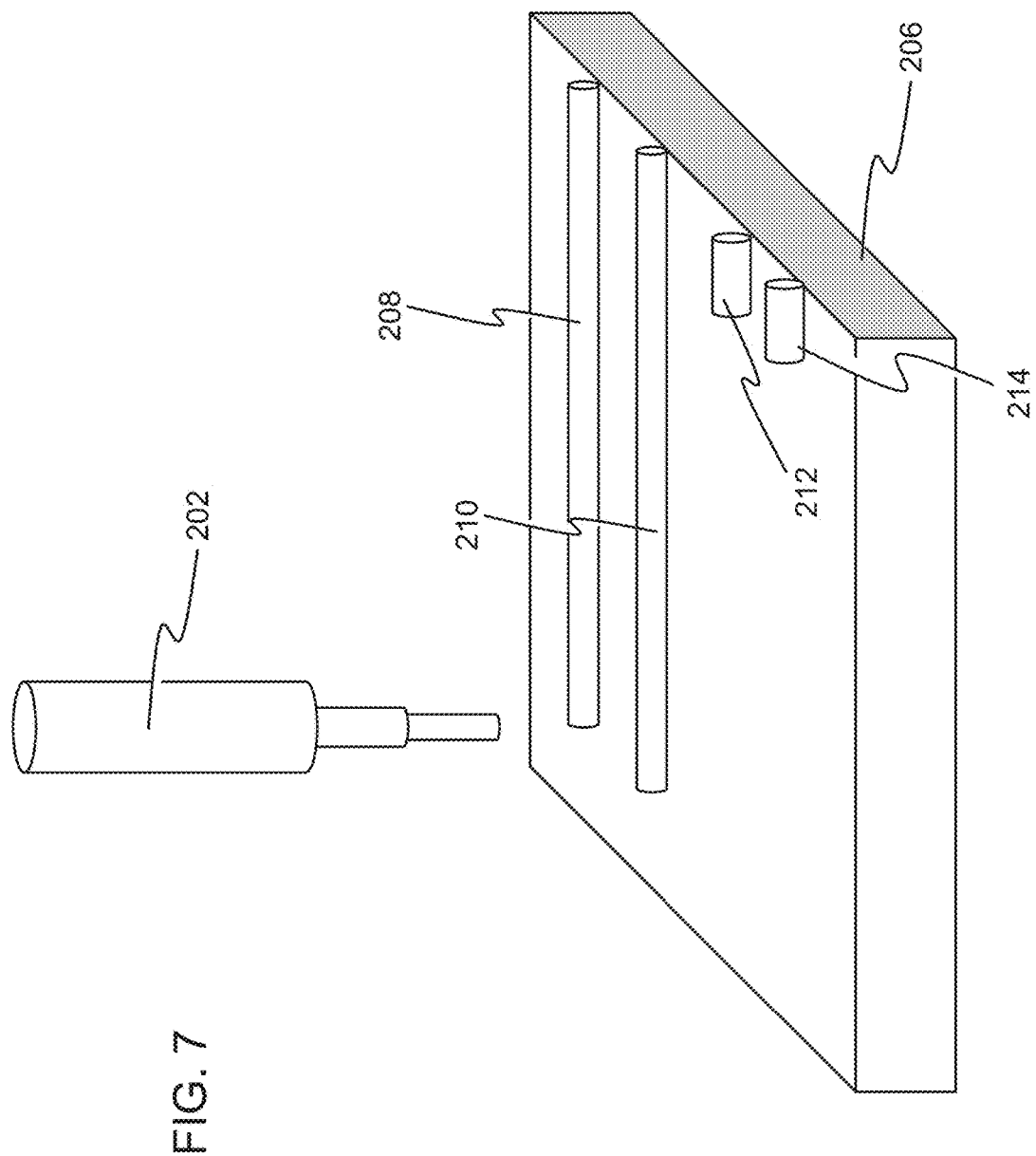

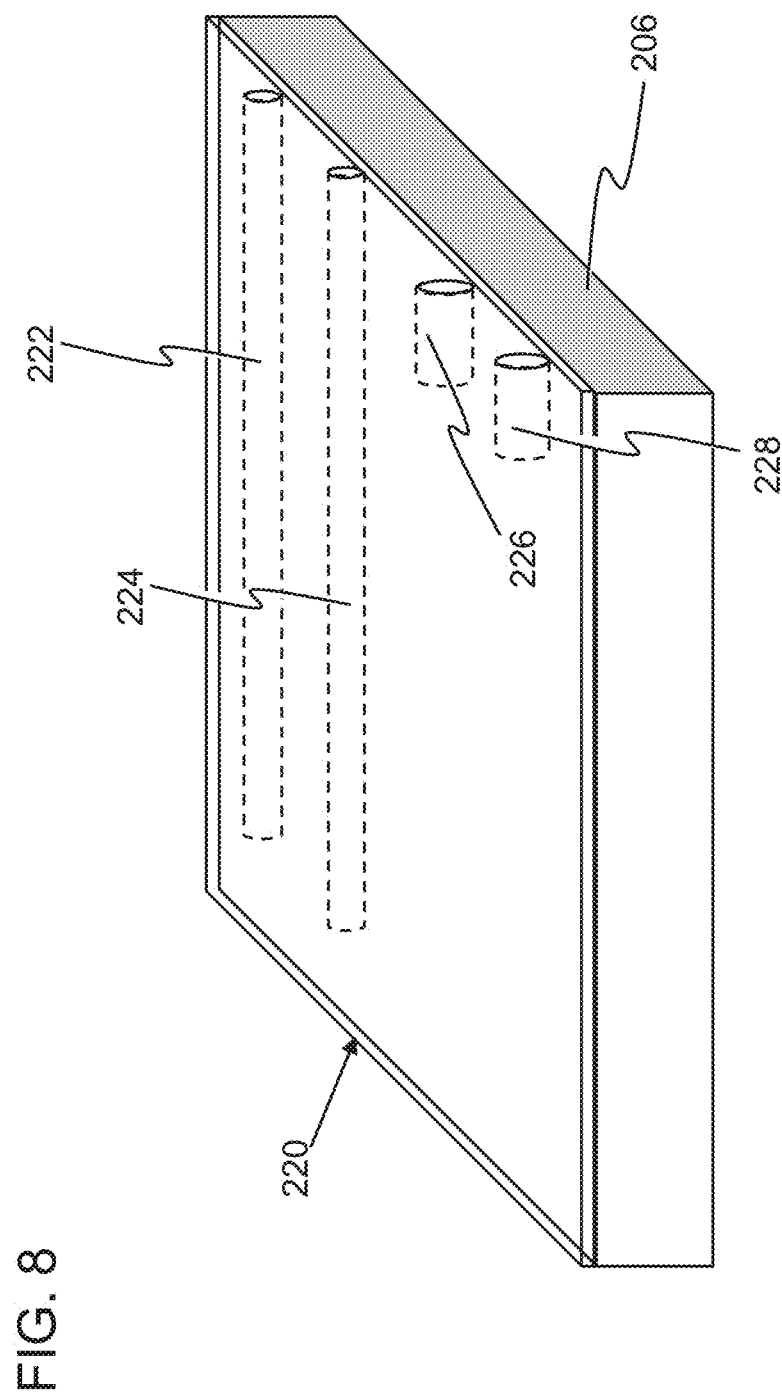

COLORIMETRIC RADIATION DOSIMETRY

BACKGROUND

Technical Field

The present invention generally relates to dosimetry, and more particularly to devices, systems and methods for colorimetric dosimetry readings.

Description of the Related Art

Exposure to radiation has become more commonplace over time due to emerging security and telecommunication technologies. Background radiation, medical radiation, security radiation, etc. all contribute to the overall radiation exposure. Radiation dose is often monitored in highly sensitive areas or where radiation applications are apparent. However, the amount of radiation exposure is not readily available in many situations.

SUMMARY

In accordance with an embodiment of the present invention, a dosimetry device includes a first chamber formed on a substrate with a first decomposable barrier sensitive to radiation and a first chemical component. A second chamber is formed on the substrate in proximity of the first chamber and includes a second decomposable barrier sensitive to radiation and a second chemical component. Upon a radiation event, decomposition of the first and second barriers of the first and second chambers permits a mixing of the first and second chemical components to cause a visible change of the dosimetry device.

Another dosimetry device includes a substrate configured to be affixed to an object and a capsule formed on the substrate. At least one chamber is formed on the substrate within the capsule. The at least one chamber includes a first decomposable barrier sensitive to radiation and a first chemical component. A second chemical component is disposed within the capsule such that, upon a radiation event, decomposition of the first barrier permits a mixing of the first and second chemical components to cause a visible change of the dosimetry device.

A method for forming a dosimetry device includes forming a chamber on a substrate including a decomposable barrier material sensitive to radiation; filling the barrier material with a first chemical component; and providing a second chemical component in proximity to the chamber such that, upon a radiation event, the barrier material decomposes to permit mixing of the first and second chemical components to cause a visible change of the dosimetry device.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 1 is a top view showing a dosimetry device having two chambers formed as pipes and including materials that are combinable to generate a new color when a barrier about the two chambers decomposes due to radiation exposure in accordance with an embodiment of the present invention;

FIG. 2 is a chemical equation showing a decomposition of a polymer barrier due to radiation in accordance with an embodiment of the present invention;

FIG. 3 is a top view showing a dosimetry device having two chambers formed as pipes that have decomposed due to radiation and includes materials that combine to generate a new color in accordance with an embodiment of the present invention;

FIG. 7 is a perspective view showing ink lines being printed by a micronozzle on a substrate to form microcapsules in accordance with an embodiment of the present invention;

FIG. 8 is a perspective view showing ink lines coated with a barrier material such that when the ink lines are removed microcapsules are formed to provide chambers in accordance with an embodiment of the present invention;

DETAILED DESCRIPTION

Figure 4:
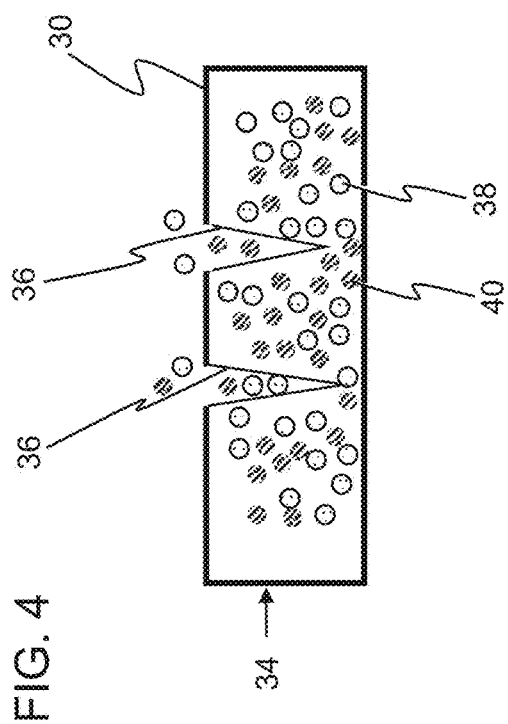
FIG. 4 is a top view showing a dosimetry device having a chamber with material that leaks out (due to radiation decomposition) into an external solution to cause a reaction to generate a new color in accordance with an embodiment of the present invention.

In accordance with aspects of the present invention, systems, devices and methods are provided to determine a dose of radiation. In some embodiments, the radiation dose can be determined for homeland security, health monitoring or any other suitable application.

In one embodiment, methods and structures provide easy to read colorimetric dosimetry in the form of a test paper or test device. After a certain dose of radiation, the test paper or device changes color, and the dose of radiation can be determined through visual inspection of a color difference. In useful embodiments, the test paper can include layers of a radiation sensitive polymer or polymers. Upon irradiation, ionization induces depolymerization of a matrix polymer. In one embodiment, radiation sensitive polymer matrices can include, e.g., at least two additional materials (e.g., water solutions of $K_4Fe(CN)_6$ and $FeCl_3$) that are separately sealed, for example, in polymer chambers (e.g., pipes or cells)). Under radiation, due to the depolymerization of the matrix, the seals are broken to release colors from the cells, e.g., $K_4Fe(CN)_6$ (yellow in color) can react with $FeCl_3$ to form a strong blue colored $Fe_4[Fe(CN)_6]_3$. By reading the color change, the radiation dose can then be determined.

It is to be understood that aspects of the present invention will be described in terms of a given illustrative structure; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including." when used herein, specify the presence of stated features, integers, steps, operations, elements and/or components, but do not preclude the presence or addition of one or more other features, integers, steps, operations, elements, components and/or groups thereof.

Spatially relative s such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a dosimetry device 10 is illustratively shown in accordance with one embodiment. The device 10 can include a capsule 12 and two chambers or pipes 14. In one embodiment, the capsule 12 is affixed to a test paper or other substrate and the pipes 14 are formed on the paper within the capsule 12. In another embodiment, the capsule 12 includes an adhesive backed material that can be applied to paper, luggage, clothing, electronic devices, office supplies, or any other object. The capsule 12 can include a plastic package (similar to a plastic bag, e.g., Mylar, polyethylene, etc.). The capsule 12 preferably includes a low profile so that in can be attached to a surface (e.g., a piece of paper, clothing, etc.). When test paper (12) is employed, the contents of the pipes 14 can leak, react and stain the paper to provide a dosimetric reading.

Each pipe 14 includes a dye, a powder, a solution with particles suspended therein or other composition. The pipes 14 include a barrier 15 formed from a material that decomposes in accordance with incident radiation. The incident radiation can include any radiation type including but not limited to atomic particles (e.g., alpha, beta, neutrons, etc.), electromagnetic radiation, (e.g., visible light, x-rays, gamma rays, infrared (IR), ultraviolet (UV), etc.) or any other form of radiation.

In one embodiment, the barrier 15 includes a material that is resistive to but decomposes after a threshold level of radiation is experienced. In useful embodiments, material such as wax, polymers or other organic materials (e.g., unsaturated aliphatic and alicyclic hydrocarbons, aromatic hydrocarbons, amino acids, etc.). In one embodiment, the barrier 15 can include multiple layers of material or include multiple material in a same layer. The multiple materials can be formed to create radiation sensitive areas on the barrier 15. In this way, certain areas can be more reactive to certain forms of radiation and a single barrier 15 can be made sensitive to multiple forms of radiation.

In one embodiment, the barrier 15 of the cells or pipes 14 can include an elastomeric polymer composite formed of, e.g., a poly(olefin sulfone) (POS) linked by "click" chemistry that can disassemble into its monomers and individual constituents when exposed to radiation.

Referring to FIG. 2, formation of an elastomeric cross-linked POS composite 17 includes bonded S and O atoms. Incident radiation can cause the decomposition of the molecule by unzipping the POS. In FIG. 2, the radical R can include R=H, $CH_3$, $CH_2$, multiples of these or other elements or groups. POSs are commonly synthesized by radical chain growth polymerization of $SO_2$ and an olefin. Bulk polymerization at low temperatures is performed with condensed liquid $SO_2$ as the solvent and tert-butyl hydroperoxide as the initiator. Polymers produced in this way display a 1:1 ratio of perfectly alternating sulfone and olefin units when there is an alkyl moiety directly linked to the olefinic residue. The precise alternation is a consequence of the propagating radicals alternatively having clear electrophilic and nucleophilic character.

As a result, olefin candidates for copolymerization with $SO_2$ should be electron-rich, sterically unhindered, non-basic, and be moderately soluble in $SO_2$. Given that POSs degrade into their volatile monomers, an elastomeric POS could be used as a material capable of being disassembled. Other materials can also be employed for selective decomposition.

Referring again to FIG. 1, the barrier 15 can be modified to make the barrier 15 more or less resistant to a particular radiation being measured. For example, the barrier 15 can include a dye or particle impregnated polymer configured to absorb a particular wavelength of light (color, UV, IR, X-ray, etc.). The dye or impregnation material can include contrast dyes or other materials that are responsive to particular wavelengths of electromagnetic radiation or atomic particles. The dye or particle impregnated polymer preferably absorbs the energy or otherwise reacts with the radiation to cause an accumulated decay or decomposition of the barrier 15.

In one embodiment, the pipes 14 include a solid compound (e.g., in powder form) and the capsule 12 includes a solvent. In another embodiment, the pipes 14 include different colored dyes. In still another embodiment, the pipes 14 include compounds suspended in solution.

Referring to FIG. 3, in one embodiment, after a certain dose of radiation, the capsule 12 (e.g., test paper) changes color, and the dose of radiation can be determined through visual inspection of a color difference. The capsule 12 can include one or more layers of a radiation sensitive polymer or polymers to form the barrier 15. Upon irradiation, ionization induces depolymerization of a matrix polymer of the barrier 15. In one embodiment, the radiation sensitive polymer matrices can include different materials 16, 18 therein (e.g., solutions 20 including water with $K_4Fe(CN)_6$ (16) and $FeCl_3$ (18)). The materials 16, 18 are separately sealed in the pipes or cells 14. Under radiation, due to the depolymerization of the matrix barrier 15, the seals are broken to release colors or materials from the cells or pipes 14.

In one example, material 16 (e.g., $K_4Fe(CN)_6$) mixes with material 18 (e.g., $FeCl_3$) to cause a reaction that forms a strong blue colored material (e.g., $Fe_4[Fe(CN)_6]_3$). The original materials 16, 18 can have different colors or be colorless. The color of the materials after mixing provides a distinct color change so that, by reading the color change, the radiation dose can then be determined. In the example, the initial materials 16, 18 are separately sealed. The test paper or capsule 12 here includes an original yellow color of $K_4Fe(CN)_6$, which becomes blue when mixed with $FeCl_3$ in this example.

In another example, the pipes 14 can include dyes that mix to provide a different color or a solution within capsule 12 interacts with solid particles in the pipes 14 once the pipe walls decompose. Other mechanisms for color changes can also be employed.

Referring to FIG. 4, in one embodiment, a single capsule or pipe 34 can be employed. Under a certain dose of radiation, a polymer matrix 30 of the pipe 34 decomposes by cracking. Cracks 36 form in the walls of the pipe or cell. The cracks 36 can be employed to indicate an amount of radiation or accumulated damage due to radiation. The particles of a material or materials 38, 40 stored within the pipe 34 can be leaked to react with material outside of the pipe 34 (e.g., solution or other material). In one embodiment, the polymer matrix 30 of the pipe 34 is configured to crack at a particular radiation dosage and form cracks 36 having a size capable or releasing the particles 38, 40 to interact with an external material (e.g., liquid, solvent, catalyst in solution, etc.) located outside of the polymer matrix 30. The crack size or cracking capability can be controlled using a stress level in the polymer, geometric features in the polymer (e.g., stress risers, thin wall regions, recesses, windows, etc.) and material properties.

In one example, the particle 38 includes $K_4Fe(CN)_6$ and particles 40 include $FeCl_3$. Upon sufficient radiation, cracks 36 form in the polymer matrix 30. The cracks 36 permit an aqueous solution to enter the polymer matrix 30 and cause the particles to react to form a blue color change. In other embodiments, the mere leaking of the contents of the pipe 34 can act as a radiation dose indication.

Figure 5:
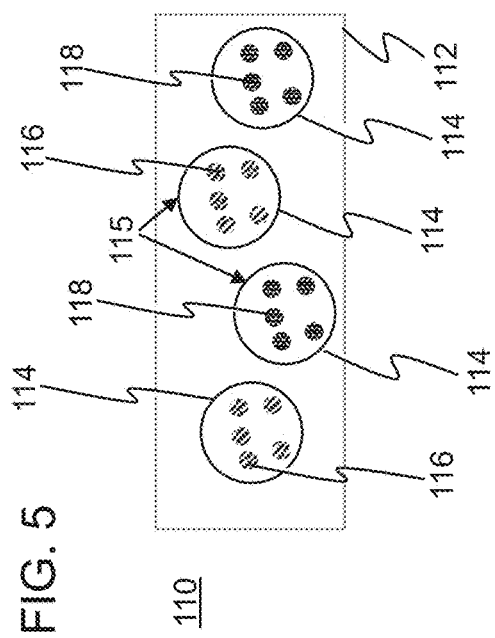
FIG. 5 is a top view showing a dosimetry device having multiple chambers formed as cells or microcapsules and including materials that are combinable to generate a new color when a barrier about the chambers decomposes due to radiation exposure in accordance with an embodiment of the present invention.

Referring to FIG. 5, another dosimetric device 110 can include a capsule 112 and a plurality of cells or microcapsules 114. The cells 114 can include different materials 116, 118 to measure a single form or amount or radiation or multiple forms or amounts or radiation. In one embodiment, different cell types can fail at different radiation levels or radiation counts. In this way, a number of different colors can be generated to indicate a type of radiation, a threshold level of radiation, an accumulated amount or radiation. In one example, first cell pairs can include two different materials that are leaked when a first type of radiation is present, and second cell pairs with two different materials can leak when a second type of radiation is present. In another example, first cell pairs can include two different materials that are leaked when a first radiation threshold has been achieved, and second cell pairs with two different materials can leak when a second radiation threshold is achieved.

In one embodiment, the capsule 112 includes a test paper where the capsule 112 is formed within or on the paper. In another embodiment, the capsule 112 includes an adhesive backed material that can be applied to paper, luggage, clothing, electronic devices, office supplies, clothing or any other object. The capsule 112 can include a plastic package (e.g., similar to a plastic bag). The capsule 112 preferably includes a low profile so that in can be attached to a surface (e.g., a piece of paper, etc.). When test paper (112) is employed, the contents of the cells 114 can leak, react and stain the paper to provide a dosimetric reading.

Each cell 114 can include a dye, a powder, a solution with particles suspended therein or other composition. The cells 114 include a barrier 115 formed from a material that decomposes in accordance with incident radiation. The incident radiation can include any radiation type including but not limited to atomic particles (e.g., alpha, beta, neutrons, etc.), electromagnetic radiation, (e.g., visible light, x-rays, gamma rays, infrared (IR), ultraviolet (UV), etc.) or any other form of radiation.

In one embodiment, the barrier 115 includes a material that is resistive to but decomposes after a threshold level of radiation is experienced. The barrier 115 can be sensitive to a type or amount of radiation. In useful embodiments, material such as wax, polymers or other organic materials (e.g., unsaturated aliphatic and alicyclic hydrocarbons, aromatic hydrocarbons, amino acids, etc.) can be employed for barrier 115.

The barrier 115 can be modified to make the barrier 115 more or less resistant to a particular radiation being measured. For example, the barrier 115 can include a dye or particle impregnated polymer configured to absorb a particular wavelength of light (color, UV, IR, X-ray, etc.). The dye or impregnation material can include contrast dyes or other materials that are responsive to particular wavelengths of electromagnetic radiation or atomic particles. The dye or particle impregnated polymer preferably absorbs the energy or otherwise reacts with the radiation to cause an accumulated decay or decomposition of the barrier 115.

In one embodiment, the cells 114 include a solid compound (e.g., in powder or gel form) and the capsule 112 contains a solvent. In another embodiment, the cells 114 include different colored dyes. In still another embodiment, the cells 114 include compounds suspended in solution.

Figure 6:
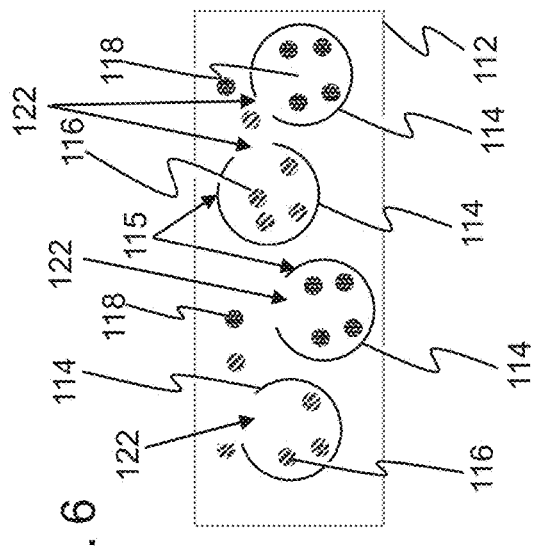
FIG. 6 is a top view showing a dosimetry device having multiple chambers formed as cells or microcapsules that have decomposed due to radiation and include materials that combine to generate a new color in accordance with an embodiment of the present invention.

Referring to FIG. 6, in one embodiment, after a certain dose of radiation, the capsule 112 changes color, and the dose of radiation can be determined through visual inspection of a color difference. The capsule 112 can include one or more layers of a radiation sensitive polymer or polymers to form the barrier 115. Upon irradiation, ionization induces depolymerization of a matrix polymer of the barrier 115 to form openings 122. In one embodiment, the radiation sensitive polymer matrices can include different materials 116, 118 therein. The different materials 116, 118 can be in solution or the solution or solvent can be present within the capsule 112. The materials 116, 118 are separately sealed in the cells 114. Under radiation, due to the depolymerization of the matrix barrier 115, the seals are broken to release colors from the cells 114.

In one example, material 116 (e.g., $K_4Fe(CN)_6$) mixes with material 118 (e.g., $FeCl_3$) to cause a reaction that forms a strong blue colored material (e.g., $Fe_4[Fe(CN)_6]_3$). The original materials 116, 118 can have different colors or be colorless. The color of the materials after mixing provides a distinct color change so that, by reading the color change, the radiation dose can then be determined. In the example, the initial materials 116, 118 are separately sealed. The test paper or capsule 112 shows the original yellow color of $K_4Fe(CN)_6$, which becomes blue when mixed with $FeCl_3$ in this example.

In other examples, the cells 114 can include dyes that mix to provide a different color, or a solution within barrier 115 interacts with solid particles in the cells 114 once the pipe wall decomposes. Other mechanisms for color changes can also be employed.

Formation of structures to form microchannels, which include pipes or microcapsules as described above, can be printed or formed on a substrate. Microchannels can be formed on the substrate by a number of different processes. In one embodiment a direct write process is employed. In another embodiment, a soft-lithography process can be utilized with a soft elastomer, e.g., poly-(dimethylsiloxane), which can be molded on a lithographically patterned photoresist on a silicon wafer (or other material) as the substrate.

After curing the elastomer in soft-lithography, the pattern can be peeled off and bonded to the surface of another substrate (e.g., test paper) to form the microchannels on a micrometer or nanometer scale. The microchannels can include square, rectangular shaped, or semi-circular cross-sections that are closed when in contact with the substrate. Microchannels can include 3D networks with soft-lithographically patterned layers that are stacked and laminated to form interconnected channels. Multiple photomasks can be employed (e.g., on for each layer of the stacked network). The photoresist material can be employed as a barrier material that degrades in the presence of a particular wavelength of light (e.g., UV).

Referring to FIGS. 7 and 8, in another embodiment, direct ink writing can be employed using a viscoelastic ink extruded from a micronozzle 202 and directly patterned onto a substrate 206. The nozzle 202 can employ a layer-by-layer approach to form a microvascular network by deposition of sacrificial filaments including a fugitive organic ink that can be encased by a matrix or barrier material (polymer, wax, etc.) that is radiation sensitive. In one embodiment, a planar configuration, as depicted, is employed. A wax-based ink can be used as the fugitive ink, which can be deposited in a straight line, periodic square wave or other shape. After deposition, the ink filaments 208, 210, 212, 214 can be molded over using a barrier material 220 (e.g., barrier 15) as depicted in FIG. 8.

The ink filaments 208, 210, 212, 214 are removed from the matrix or barrier material 220 to form the microchannels 222, 224, 226, 228 by melting the ink (liquefaction). The ink is removed to form microchannels 222, 224, 226, 228. Feature sizes of the cylindrical microchannels 222, 224, 226, 228 can be from about 10 to about 200 microns.

Once the microchannels 222, 224, 226, 228 are formed, the microchannels 222, 224, 226, 228 can be filled and sealed using another micronozzle, or can be selectively filled by submerging the substrate 206 with selected channels opened or blocked using lasers, lithography, patterned deposition of material, etc. In this way, the microchannels 222, 224, 226, 228 can be filled with dyes, powders, solutions, etc.

The filled microchannels 222, 224, 226, 228 can be left exposed or can be coated or packaged with a capsule (e.g., capsule 12, 122, etc.). The substrate 206 can be diced to form multiple devices in a single process. Multiple barrier materials 220 can be employed on a same device.

Figure 9:
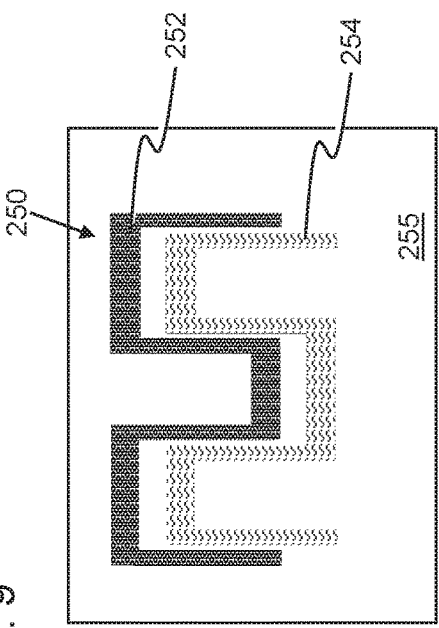
FIG. 9 is a top view showing two chamber square waves for pipes that include chemical compounds that can combine to generate a new color in accordance with an embodiment of the present invention.

Referring to FIG. 9, the microchannels for forming pipes or cells can include any pattern or configuration of a substrate 255. The substrate 255 can include a semiconductor substrate, a plastic material, paper, etc. In one useful embodiment, a square wave pattern 250 is employed using two square wave cells 252 and 254 that trace one another to permit mixing of the contents of the cells 252 and 254 upon decomposition of barrier material on the cells 252 and 254. The two square wave cells 252 and 254 can be placed within a capsule.

Figure 10:
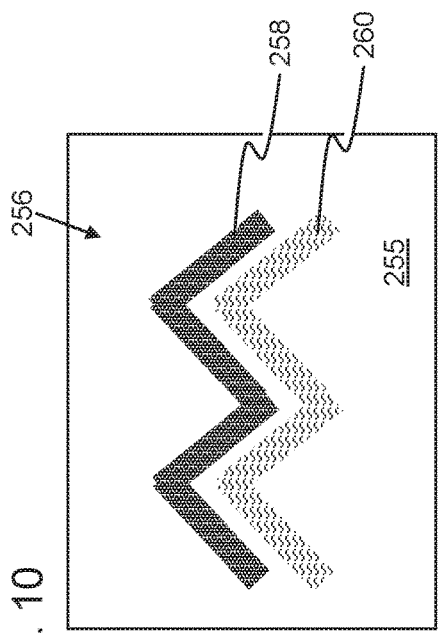
FIG. 10 is a top view showing a two chamber zig-zag for pipes that include chemical compounds that can combine to generate a new color in accordance with an embodiment of the present invention.

Referring to FIG. 10, in another useful embodiment, a zig-zag pattern 256 is employed using two cells 258 and 260 that trace one another to permit mixing of the contents of the cells 258 and 260 upon decomposition of barrier material of the cells 258 and 260.

Figure 11:
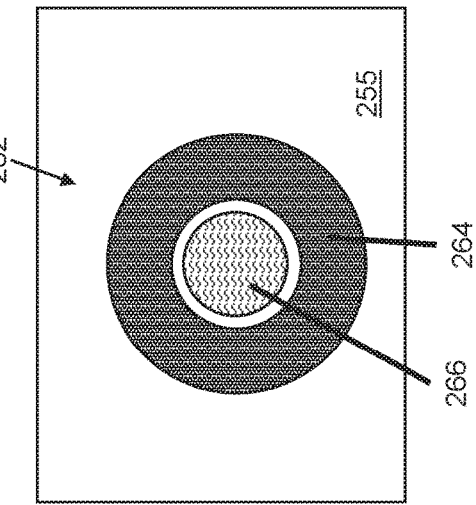
FIG. 11 is a top view showing two chamber concentric shapes for cells that include chemical compounds that can combine to generate a new color in accordance with an embodiment of the present invention.

Referring to FIG. 11, in another useful embodiment, a concentric pattern 262 is employed using two cells 264 and 266 that are concentrically disposed to one another to permit mixing of the contents of the cells 264 and 266 upon decomposition of barrier material of the cells 264 and 266. Other shapes or configurations are also contemplated, e.g., a cylinder in a cylinder, box in a box, or other shape(s) can be employed.

Figure 12:
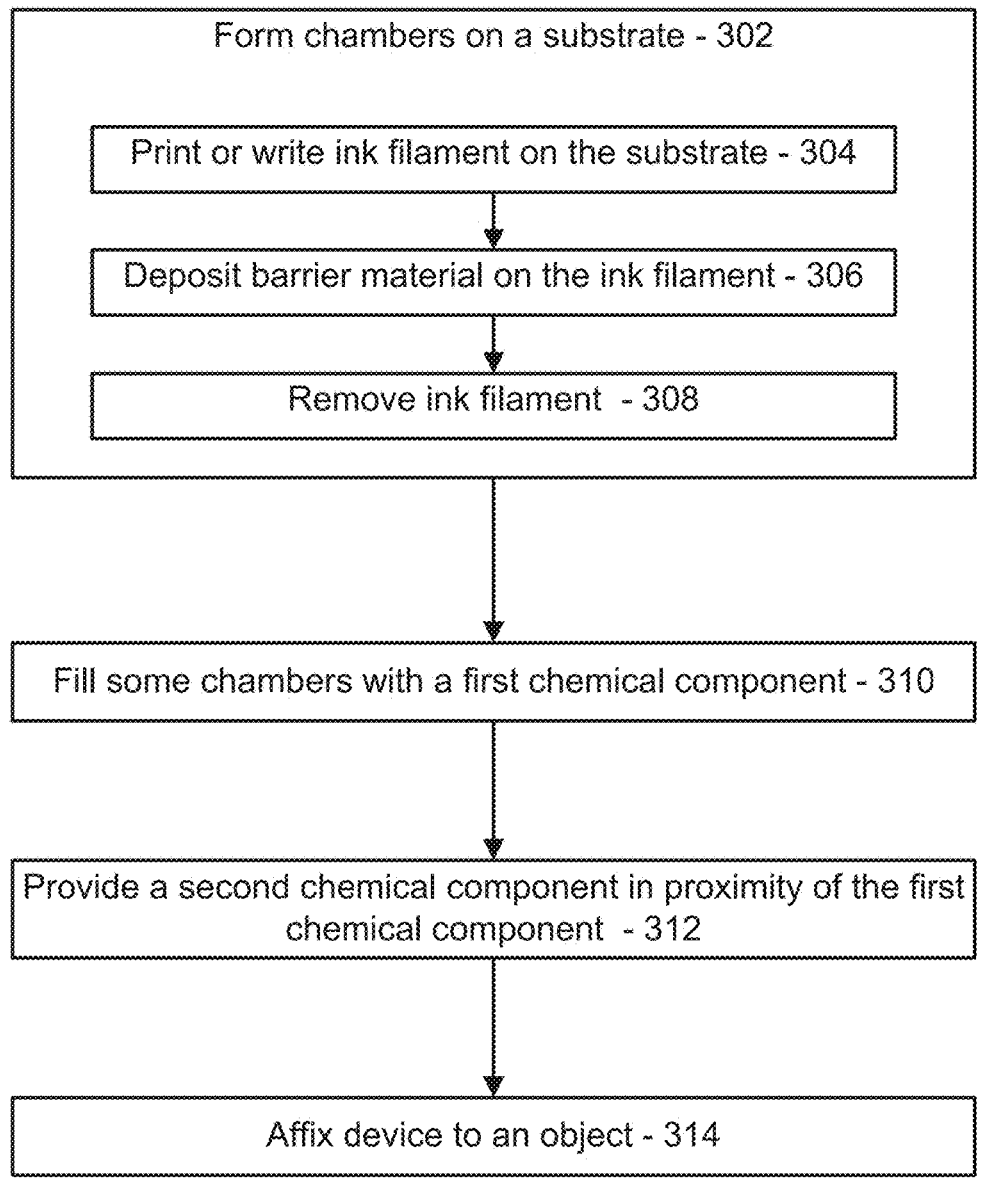
FIG. 12 is a block/flow diagram showing methods for fabricating a dosimetry device in accordance with embodiments of the present invention.

Referring to FIG. 12, methods for forming a dosimetry device are shown in accordance with illustrative embodiments. In some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 302, one or more chambers are formed on a substrate. The chambers can include pipes, channels, cells, microcapsules, etc. The chambers include a decomposable barrier material sensitive to radiation. The decomposable barrier material can be configured to decompose in accordance with a type and/or quantity of radiation. In block 304, forming the chamber can include printing an ink filament on the substrate and depositing the barrier material on the ink filament in block 306. The filament can include one, two or three dimensional shapes. The shapes can be nested or overlapped. Different materials can be employed for the barrier material in different regions of the same device. In block 308, the ink filament can be liquefied and removed to form the chamber. The liquefaction can include melting the ink filament, which can include a wax ink. Other processes can be employed to form the chambers instead of or in addition to printing.

In block 310, at least some chambers are filled within the barrier material with a first chemical component. In block 312, a second chemical component is provided in proximity of the chambers with the first chemical component. Providing the second chemical component can include forming a capsule over the chambers with the first chemical component, forming another set of chambers with the second chemical component adjacent to the chambers with the first chemical component, etc.

Upon a radiation event (type and/or quantity of radiation), the barrier material decomposes to permit mixing of the first and second chemical components to cause a visible change of the dosimetry device. In one embodiment, the first and second chemical components react or leak to provide a color change.

In block 314, the dosimetry device can optionally be affixed to an object to measure radiation exposure. In one embodiment, the dosimetry device can be employed on identification badges or personnel badges (e.g., airport or medical personnel), items passed through x-ray machines (e.g., at airports, etc.), on equipment, etc. The dosimetry device in accordance with aspects of the present invention provides an easy, inexpensive radiation dose and type test device that can be employed in any number of applications.

Having described preferred embodiments for colorimetric radiation dosimetry (which are intended to be illustrative and not limiting), it is noted that modifications and variations can be made by persons skilled in the art in light of the above teachings. It is therefore to be understood that changes can be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A dosimetry device, comprising:
   a first chamber, including:
      a first decomposable barrier sensitive to radiation; and
      a first chemical component; and
   a second chamber, including:
      a second decomposable barrier sensitive to radiation; and
      a second chemical component;
   wherein, upon a radiation event, decomposition of the first and second barriers of the first and second chambers permits a mixing of the first and second chemical components to cause a visible change of the dosimetry device.

2. The device as recited in claim 1, wherein the first and second chemical components react to provide a color change.

3. The device as recited in claim 1, wherein the first and second chemical components are selected from a group consisting of: dye, a powder and a solution with particles suspended therein.

4. The device as recited in claim 1, wherein the first and second chambers are included in a capsule.

5. The device as recited in claim 1, wherein the capsule includes a solvent for mixing the first and second chemical components.

6. The device as recited in claim 1, wherein the first and second chambers include a pipe or channel.

7. The device as recited in claim 1, wherein the first and second chambers include a plurality of cells or microcapsules.

8. The device as recited in claim 1, wherein the first and second chambers include multidimensional shapes.

9. A dosimetry device, comprising:
   at least one chamber, said chamber including around said chamber a decomposable barrier sensitive to radiation, wherein, upon a radiation event, decomposition of the decomposable barrier causes a visible change of the dosimetry device to indicate an amount of radiation exposure.

10. The dosimetry device as recited in claim 9, wherein the decomposable barrier is configured to decompose by cracking and an amount of cracking is indicative of the amount of radiation exposure.

11. The dosimetry device as recited in claim 9, wherein:
    the at least one chamber comprises a first chamber which includes at least one chemical component; and
    an external chemical component is disposed outside of the chamber, wherein, upon a radiation event, decomposition of the decomposable barrier of the first chamber permits a mixing of the at least one chemical component and the external chemical component to cause visible changes of the dosimetry device.

12. The dosimetry device as recited in claim 11, wherein the first chamber includes a first chemical component and a second chemical component which are configured to mix with the external chemical component when the decomposable barrier decomposes upon a radiation event.

13. The dosimetry device as recited in claim 9, wherein:
    the dosimetry device includes a plurality of chambers;
    the plurality of chambers having decomposable barriers that are configured to decompose from different amounts of radiation exposure.

14. A method for forming a dosimetry device, comprising:
forming at least one chamber which includes a decomposable barrier material sensitive to radiation;
filling the barrier material with at least one chemical component;
wherein, upon a radiation event, decomposition of the decomposable barrier material causes a visible change of the dosimetry device to indicate an amount of radiation exposure.

15. The method of claim 14, wherein the at least one chamber comprises a first chamber and a second chamber and the at least one chemical component comprises a first chemical component and a second chemical component, further comprising the steps of:
filling the barrier material on the first chamber with a first chemical component; and
filling the barrier material on the second chamber with a second chemical component such that, upon the radiation event, the barrier material decomposes to permit mixing of the first and second chemical components to cause a visible change of the dosimetry device.

16. The method as recited in claim 14, wherein forming the at least one chamber includes:
writing an ink filament on the substrate;
depositing the barrier material on the ink filament; and
liquefying and removing the ink filament to form the chamber.

17. The method as recited in claim 14, further comprising affixing the dosimetry device to an object to measure radiation exposure.

18. The method as recited in claim 14, wherein the decomposable barrier material is configured to decompose by cracking and an amount of cracking is indicative of the amount of radiation exposure.

19. The method as recited in claim 14, comprising the further steps of:
depositing an external chemical component disposed outside of the at least one chamber, wherein, upon the radiation event, decomposition of the decomposable barrier material permits a mixing of the at least one chemical component and the external chemical component to cause visible changes indicative of the amount of radiation exposure.

20. The method as recited in claim 14, wherein a plurality of chambers is formed including a first chamber and a second chamber each having the decomposable barrier material that is respectively configured to decompose from exposure to a different amount of radiation.

* * * * *